US008610096B2

(12) United States Patent
Touya

(10) Patent No.: US 8,610,096 B2
(45) Date of Patent: Dec. 17, 2013

(54) CHARGED PARTICLE BEAM WRITING APPARATUS AND METHOD

(75) Inventor: Takanao Touya, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 222 days.

(21) Appl. No.: 13/312,173

(22) Filed: Dec. 6, 2011

(65) Prior Publication Data

US 2012/0193553 A1    Aug. 2, 2012

(30) Foreign Application Priority Data

Jan. 31, 2011    (JP) ................................ 2011-019250

(51) Int. Cl.
*H01J 37/304* (2006.01)
*G03F 9/00* (2006.01)
*G21K 5/00* (2006.01)

(52) U.S. Cl.
USPC ............... 250/559.22; 250/559.2; 250/492.1; 250/492.2; 250/492.22; 250/492.23

(58) Field of Classification Search
USPC ........... 250/252.1, 306, 307, 310, 311, 472.1, 250/473.1, 491.1, 492.1, 492.2, 492.22, 250/492.23, 492.3, 559.19, 559.2, 559.22
See application file for complete search history.

(56) References Cited

U.S. PATENT DOCUMENTS

| 6,407,398 | B1 | 6/2002 | Kurokawa et al. | |
| 6,797,965 | B2* | 9/2004 | Abe | 250/491.1 |
| 8,067,753 | B2 | 11/2011 | Touya | |
| 2001/0052573 | A1* | 12/2001 | Takakuwa | 250/398 |
| 2003/0075691 | A1* | 4/2003 | Abe | 250/491.1 |
| 2007/0114453 | A1 | 5/2007 | Emi et al. | |
| 2010/0207017 | A1* | 8/2010 | Horiuchi et al. | 250/252.1 |
| 2013/0214172 | A1 | 8/2013 | Touya et al. | |
| 2013/0216953 | A1 | 8/2013 | Touya et al. | |

FOREIGN PATENT DOCUMENTS

| JP | 61-034936 | 2/1986 |
| JP | 05-047648 | 2/1993 |
| JP | 2007-150243 | 6/2007 |
| JP | 2010-192538 | 9/2010 |
| KR | 10-2004-0081309 A | 9/2004 |

OTHER PUBLICATIONS

U.S. Appl. No. 13/763,976, filed Feb. 11, 2013, Touya, et al.
Office Action issued Jul. 4, 2013 in Korean Patent Application No. 10-2012-0006022 (with English language translation).

* cited by examiner

*Primary Examiner* — Bernard E Souw
(74) *Attorney, Agent, or Firm* — Oblon, Spivak, McClelland, Maier & Neustadt, L.L.P.

(57) ABSTRACT

A charged-particle beam writing apparatus used for writing a predetermined pattern on a sample placed on a stage with a charged-particle beam. The apparatus comprises a height measuring unit that measures a height of the sample by irradiating the sample with light and receiving light reflected from the sample, and a control unit that receives either of height data acquired from a height data map prepared based on values measured by the height measuring unit before writing and height data measured by the height measuring unit during writing, thereby adjust an irradiation position of the charged-particle beam on the sample.

18 Claims, 5 Drawing Sheets

CHARGED PARTICLE BEAM WRITING APPARATUS AND METHOD

CROSS-REFERENCE TO THE RELATED APPLICATION

The entire disclosure of the Japanese Patent Application No. 2011-019250, filed on Jan. 31, 2011 including specification, claims, drawings, and summary, on which the Convention priority of the present application is based, are incorporated herein in its entirety.

FIELD OF THE INVENTION

The present invention relates to an apparatus and method for writing patterns with charged-particle beams.

BACKGROUND

The tendency in recent years towards higher mounting densities and larger capacities of large-scale integrated (LSI) circuits are further reducing the circuit line widths needed for semiconductor devices. Fabrication of semiconductor devices involves the use of photomasks or reticles (hereinafter, referred to collectively as masks) each having circuit patterns formed thereon. The circuit patterns on a mask are photolithographically transferred on to a wafer using a reduction projection exposure apparatus, often called a stepper, whereby the circuit patterns are formed on the wafer. An electron beam writing apparatus capable of writing fine patterns is used to manufacture the masks used to transfer the fine circuit patterns onto the wafer. Developing a laser beam writing apparatus for writing patterns with laser beams has also been attempted. An electron beam writing apparatus is also used for writing circuit patterns directly onto the wafer.

An electron beam writing apparatus has inherently superior resolution, and can ensure greater depth of focus, thus allowing control over size fluctuations even with a high difference in level. Japanese Patent Application Laid-Open No. Sho 61-34936 discloses a method for manufacturing a semiconductor integrated circuit device using an electron beam writing apparatus.

When a pattern is written on a mask using such an electron beam writing apparatus, it is necessary to measure the surface height of the mask before writing to avoid displacement of a writing position or defocusing of an electron beam. If the surface of the mask is perfectly flat, a desired pattern can be written by measuring the surface height of the mask, at any one point on the mask, and focusing the electron beam based on this surface height. However, in fact, the surface of the mask is not perfectly flat and is slightly deformed. Therefore, when the electron beam is always focused based on a surface height measured at only one point on the mask, defocusing occurs in some portions on the mask.

In order to solve such a problem, Japanese Patent Application Laid-Open No. Sho 61-34936 discloses a method for correcting defocusing caused by deformation of a mask. According to this method, the surface height of a mask is first measured at several points on the mask to obtain a plurality of quadratic equations. Then, the coefficients of these quadratic equations are determined by the least squares method, and a height correction equation using the obtained coefficients is used to perform focus correction and deflection gain correction.

In addition, Japanese Patent Application Laid-Open No. Hei 5-47648 discloses the height in several points outside the exposure territory of the mask is measured, the method of setting the height of lighting position from the value which is obtained is disclosed.

However, in the correction method described in the above patent documents, the height of the mask is calculated by interpolation using measurement results measured at several points on the surface of the mask. Therefore, the surface shape of the actual mask can be approximated but the exact surface shape of the mask cannot be determined.

Further, in order to improve the throughput of an electron beam writing apparatus, writing time is reduced by increasing the moving speed of a stage in a region where a pattern density is low. When the moving speed of the stage is changed as described above, the stage undergoes acceleration at the beginning of the region and then undergoes deceleration at the end of the region. At this time, inertial force is exerted on a mask by acceleration and deceleration of the stage, and therefore the surface height of the mask varies and becomes different from height data determined before writing.

On the one hand, if it is possible to measure the height of the mask surface when writing, it is therefore possible to solve the above-mentioned problem. But, in this case, the following kind of problem occurs.

When a mask is irradiated with an electron beam, a resist formed on a light-blocking layer formed on a mask substrate with the use of a conductive material such as chromium (Cr) becomes charged. When the mask is kept irradiated in such a state, the path of the electron beam is deflected by an electric field created by the charged mask, which makes it impossible to perform writing to a desired position. In order to solve such a problem, a charged layer is grounded. For example, a support mechanism is provided so as to surround a mask placed on a stage, and a substrate cover is provided on the support mechanism. The substrate cover is grounded by connecting the support mechanism to ground, and therefore electrons scattering near the peripheral portion of the mask are captured by the substrate cover so that the peripheral portion of the mask is prevented from becoming charged.

However, when such a substrate cover is used to measure the surface height of a mask in real time during writing, height measurement cannot be performed in some regions. This results from that height measurement is performed by detecting the reflection of light emitted toward a point near the irradiation region of an electron beam. That is, as described above, the substrate cover is placed over the mask during writing. Therefore, light emitted toward the mask for height measurement is blocked by the substrate cover in a case where the surface height of the mask needs to be measured near the substrate cover. In this case, light reflected from the surface of the mask cannot be detected, which makes it impossible to perform height measurement.

Even when height measurement can be performed, the following problem may occur. Height measurement data acquired during writing is sent from a height measuring unit to a writing control unit of an electron beam writing apparatus, and then an electron beam optical unit is adjusted based on this data. However, for example, if errors occur during data communication between the height measuring unit and the control unit, the height measurement data is not sent to the control unit. In this case, the control unit fails to acquire data as in a case where height measurement cannot be performed.

The present invention has been made with the above taken into account. That is, an object of the invention is to provide a charged-particle beam writing apparatus measuring exactly the surface shape of a sample and then writing high accuracy.

These and other advantages of the present invention will become clear in view of the following description.

SUMMARY OF THE INVENTION

The present invention relates to a charged-particle beam writing apparatus for writing a predetermined pattern on a sample placed on a stage with a charged-particle beam, the apparatus comprising: a height measuring unit that measures a height of the sample by irradiating the sample with light and receiving light reflected from the sample, and a control unit that receives either of height data acquired from a height data map prepared based on values measured by the height measuring unit before writing and height data measured by the height measuring unit during writing to adjust an irradiation position of the charged-particle beam on the sample.

In another aspect of this invention, a charged-particle beam writing apparatus wherein the height measuring unit measures the height of the sample in real time concurrently with writing.

In another aspect of this invention, a charged-particle beam writing apparatus wherein an amount of the reflected light is equal to or larger than a threshold value, the control unit receives height data measured by the height measuring unit during writing, and when the amount of the reflected light is less than the threshold value, the control unit receives height data acquired from the height data map.

In another aspect of this invention, a charged-particle beam writing apparatus wherein the control unit receives height data acquired from the height data map as height data of coordinates within a predetermined region.

In another aspect of this invention, a charged-particle beam writing apparatus, wherein the apparatus comprises: a support mechanism that is provided so as to surround the sample placed on the stage, a substrate cover that is provided on the support mechanism, wherein the substrate cover is grounded by connecting the support mechanism to ground, wherein the predetermined region is a region where the irradiated light is blocked by the substrate cover.

In another aspect of this invention, a charged-particle beam, wherein when a difference between height data measured by the height measuring unit during writing and height data measured previously is equal to or less than a threshold value, the control unit receives the height data measured by the height measuring unit during writing, and when the difference is larger than the threshold value, the control unit receives height data acquired from the height data map.

In another aspect of this invention, a charged-particle beam writing apparatus for writing a predetermined pattern on a sample placed on a stage with a charged-particle beam, the apparatus comprising: a height measuring unit that measures a height of the sample by irradiating the sample with light and receiving light reflected from the sample, and a control unit that receives a value obtained by adding an offset value, obtained from a difference between height data acquired from a height data map prepared based on values measured by the height measuring unit before writing and height data measured by the height measuring unit during writing, to the height data map to adjust an irradiation position of the charged-particle beam on the sample.

In another aspect of this invention, a charged-particle beam writing apparatus, wherein the height data map contains height data including measured values, and height data including values determined from the measured values by interpolation.

In another aspect of this invention, a charged-particle beam writing apparatus, wherein the offset value is updated only when the amount of light reflected from the surface of the sample is equal to or larger than a threshold value.

In another embodiment of this invention, a charged-particle beam writing method for writing a predetermined pattern on a sample placed on a stage with a charged-particle beam, the method comprising: measuring a height of the sample by irradiating the sample with light and receiving light reflected from the sample, and using either height data acquired from a height data map prepared based on values measured before writing, or height data measured during writing to adjust an irradiation position of the charged-particle beam on the sample.

In another aspect of this invention, a charged-particle beam writing method wherein the measurement of height of the sample is performed in real time concurrently with writing.

In another aspect of this invention, a charged-particle beam writing method, wherein when an amount of the reflected light is equal to or larger than a threshold value, using height data measured during writing, and when the amount of the reflected light is less than the threshold value, using height data acquired from the height data map.

In another aspect of this invention, a charged-particle beam writing method, wherein height data acquired from the height data map is received as height data of coordinates within a predetermined region.

In another aspect of this invention, a charged-particle beam writing method, a support mechanism is provided so as to surround a mask placed on a stage, and providing a substrate cover on the support mechanism, wherein the substrate cover is grounded by connecting the support mechanism to ground, and wherein the predetermined region is a region where the irradiated light is blocked by the substrate cover.

In another aspect of this invention, a charged-particle beam writing method, wherein the height data measured during writing is used when a difference between height data measured during writing, and height data measured previously is equal to or less than a threshold value, and using height data acquired from the height data map when the difference is larger than the threshold value.

In another embodiment of this invention, a charged-particle beam writing method for writing a predetermined pattern on a sample placed on a stage with a charged-particle beam, the method comprising:

measuring a height of the sample by irradiating the sample with light and receiving light reflected from the sample, and using a value obtained by adding an offset value, obtained from a difference between height data acquired from a height data map prepared based on values measured before writing, and height data measured during writing, to the height data map to adjust an irradiation position of the charged-particle beam on the sample.

In another embodiment of this invention, a charged-particle beam writing method, wherein the height data map contains height data including measured values and height data including values determined from the measured values by interpolation.

In another embodiment of this invention, a charged-particle beam writing method, wherein the offset value is updated only when the amount of light reflected from the surface of the sample is equal to or larger than a threshold value.

DETAILED DESCRIPTION OF THE EMBODIMENTS

Figure 1:
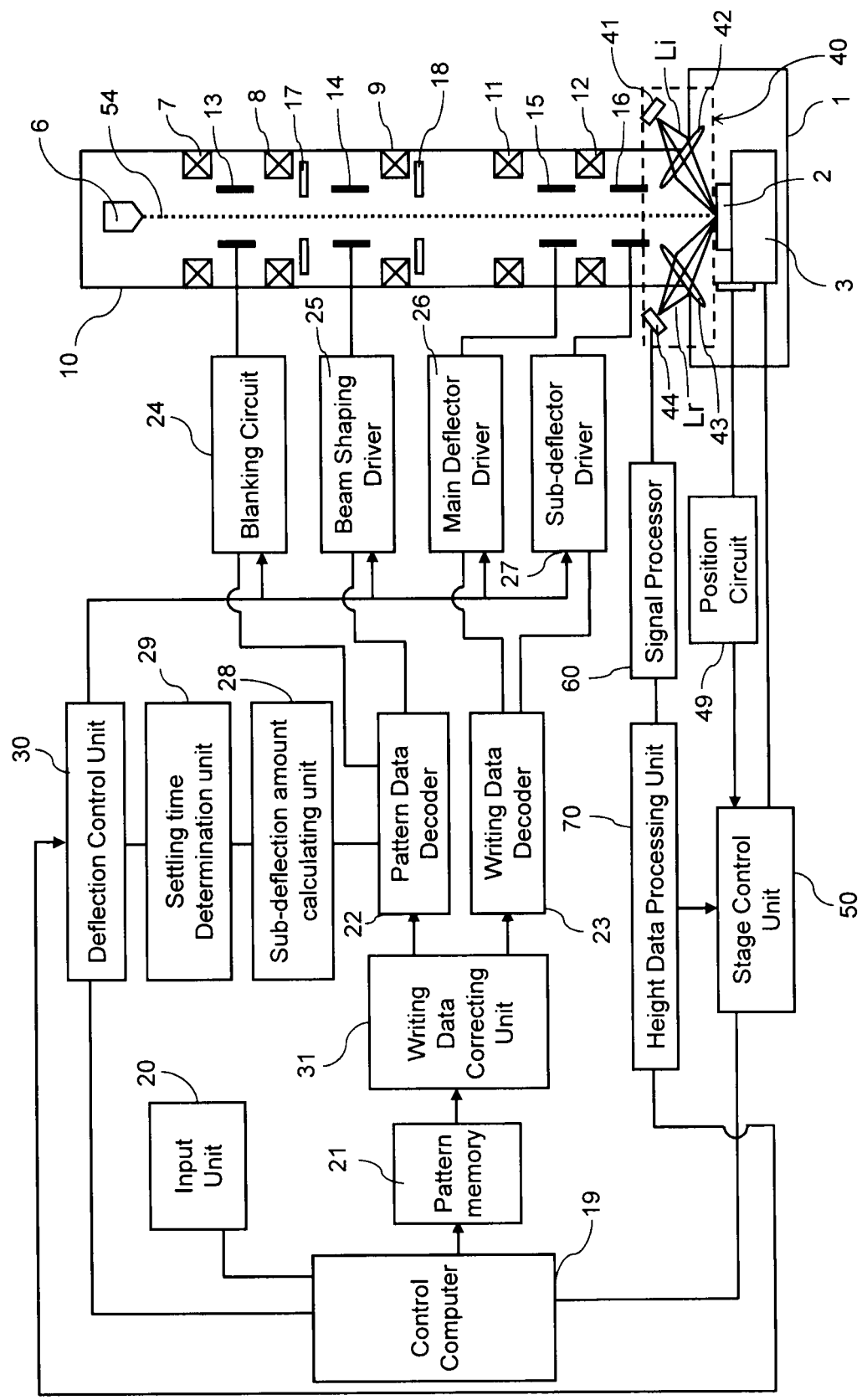
FIG. 1 is a block diagram of an electron beam writing apparatus according to an embodiment of the present invention.

FIG. 1 is a schematic diagram of an electron beam writing apparatus according to an embodiment of the present invention.

As shown in FIG. 1, in an electron beam writing apparatus, a writing chamber 1 a houses a stage 3 which on which a mask 2 as a sample is mounted. The mask 2 has a mask substrate consisting of quartz or a similar material, a chromium (Cr) film as a light shielding film on the mask substrate, and a resist film on the chromium film.

A stage control unit 50 causes the stage 3 to move in the x direction (i.e., the lateral direction to the plane of the paper in FIG. 1) and the y direction (i.e., the direction perpendicular to the plane of the paper in FIG. 1). Movement of the location of Stage 3 is measured using a position circuit 49, which uses a precision measuring instrument using a laser. The stage control unit 50 adjusts the stage 3 to a desired position on the basis of data from the position circuit 49.

An electron beam optical unit 10 is disposed above the writing chamber 1. The electron beam optical unit 10 includes an electron gun 6, lenses 7, 8, 9, 11, 12, a blanking deflector 13, a shaping deflector 14, a main deflector 15 for beam scanning, a sub-deflector 16 for beam scanning, a first aperture 17 for beam shaping, a second aperture 18 for beam shaping and can include other elements.

Figure 2:
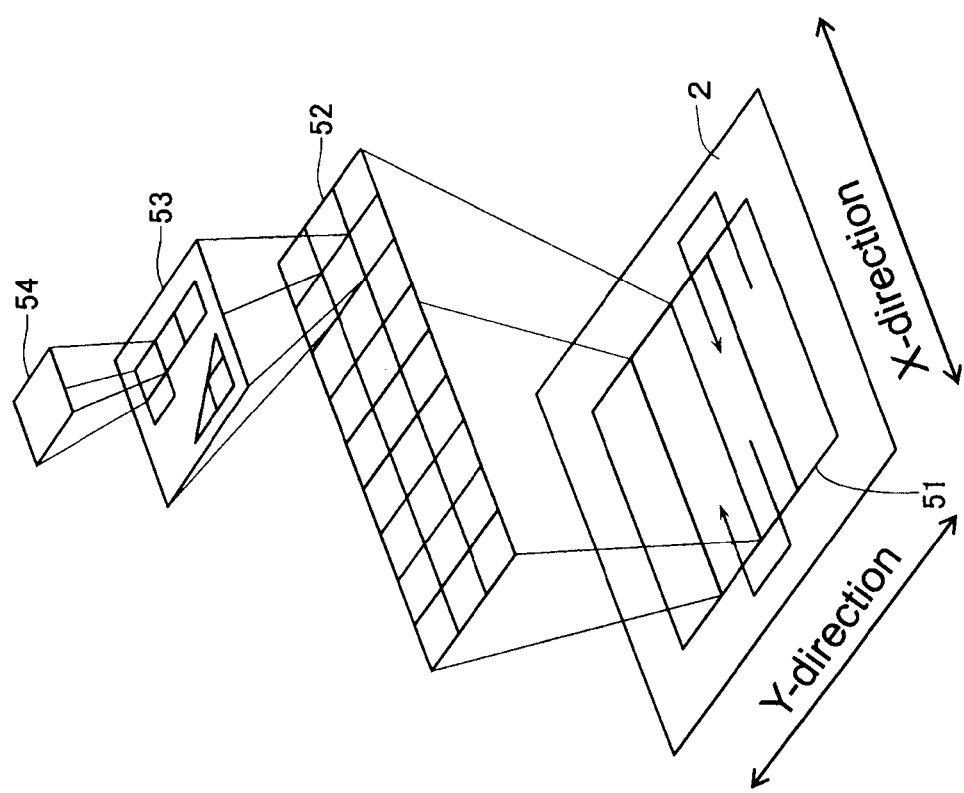
FIG. 2 is an illustrative diagram of writing with electron beams.

FIG. 2 is an illustrative diagram of writing with electron beams. As shown in FIG. 2, patterns 51 that will be written on the mask substrate 2 are each divided into rectangular frame regions 52. Writing with an electron beam 54 is repeated for each frame region 52 while the stage 3 continuously moves in one direction, for example in the plus or minus X-direction. The frame region 52 is further divided into sub-deflection regions 53, and the electron beam 54 writes only necessary internal portions of each sub-deflection region 53. The frame region 52 is a rectangular writing region determined by deflection width of the main deflector 15, and the sub-deflection region 53 is a unitary writing region determined by deflection width of the sub-deflector 16.

The determination of the standard position of the sub-deflection regions 53 is done with main deflector 15, writing inside the sub-deflection regions 53 is controlled by sub-deflector 16. That is, the electron beam 54 is positioned in the specified sub-deflection regions 53 by the main deflector 15, determining the writing position inside sub-deflection regions 53 by the sub-deflector 16. Furthermore, the shape and size of electron beam 54 is determined by shaping deflector 14, and the aperture 17 and 18 for shaping the electron beam.

While the stage 3 is continuously moved in one direction, the inside of the sub-deflection region 53 is patterned, and upon completion of the writing, the next sub-deflection region 53 is written. After all internal sub-deflection regions 53 of the frame region 52 have been written, the stage 3 is moved in steps in a direction (e.g., the plus or minus Y-direction) that is orthogonal to the continuous moving direction. After this, similar processing is repeated for sequential writing of the frame region 52.

The sub-deflection regions 53 are regions which are scanned and written by the electron beam 54, faster than scanning and writing of frame region 52 by sub-deflector 16, sub-deflection regions 53 are usually the smallest writing regions. When writing is performed inside the sub-deflection regions 53, the size and shape of shot are prepared according to the pattern shape, the shaping deflector 14 then forms the desired shot. Specifically, the electron beam 54 is irradiated from the electron gun 6, the 1st aperture 17 forms the beam into a square shape, the electron beam is then projected to the 2nd aperture 18 by the shaping deflector 14, the 2nd aperture 18 changes the beam shape and size. After that, the electron beam 54 deflected by sub-deflector 16 and main deflector 15, is irradiated to the mask 2 which is mounted on stage 3.

CAD data prepared by the designer (or user) is converted to design intermediate data in a hierarchical format such as OASIS. The design intermediate data includes data of the pattern formed on the mask created for each layer. It should be noted that, generally, the electron beam writing apparatuses are not adapted to be able to directly read OASIS data. That is, each manufacturer of the electron beam writing apparatus uses different format data. Therefore, OASIS data is converted, for each layer, to format data in a format specific to the electron beam writing apparatus used, and this format data is input to the electron beam writing apparatus.

In FIG. 1, format data is entered into the input unit 20 of the electron beam writing apparatus via a magnetic disk as a memory medium. The designed pattern includes pattern features each consisting of basic features such as rectangles and triangles. The input unit 20 stores feature data indicating the shape, size, and position of each pattern feature, specifically, e.g., information such as the coordinates (x, y) of the reference position of each feature, the length of its sides, and a shape code (or identifier) identifying the type of shape such as a rectangle or triangle.

Further, a group of pattern features, defined in an area of approximately a few tens of micrometers square is referred to as a "cluster" or "cell". It is common practice that the design pattern data is defined in a hierarchical structure using clusters or cells. A cluster (or cell), which contains a pattern feature or features, may be used alone or repeated at certain intervals. In the former case the coordinate positions of the cluster (or cell) on the photomask are specified, whereas in the latter case the coordinate positions of each copy of the cluster (or cell) are indicated together with a repetition instruction. Each cluster (or cell) is disposed in a strip-shaped region, referred to as a "frame" or "stripe", having a width of a few hundreds of micrometers and a length of approximately 100 mm which corresponds to the length of the photomask in the X or Y direction.

The division of the pattern into pattern elements is performed based on the maximum shot size determined by the size of the electron beam, and the coordinate positions, size, and exposure time of each divided shot are also set. Then, writing data is generated so that each shot is shaped in accordance with the shape or size of a pattern element to be written. The writing data is divided into strip-like frame regions (main deflection regions), and each of the frame regions is further divided into sub-deflection regions. That is, the writing data of the entire chip has a hierarchical data structure including the data of a plurality of strip-like frames whose size corresponds to the size of the main deflection region and the data of a plurality of sub-deflection region units, smaller in size than the main deflection region, in the frame.

The pattern writing data read from the input unit 20 by the control computer 19 is temporarily stored in pattern memory 22 on a frame region basis in FIG. 2. The pattern data for each frame region stored in the pattern memory 22, that is, frame information which includes pattern writing position data, pattern shape data, etc., is sent to a writing data correcting unit 31.

In the writing data correcting unit 31, drift correction is performed at a specified time interval based on the original design value data. That is, correction value for drift correction is calculated on the basis of the drift quantity measured, the data of design value and the data of correction value are added and it is synthesized. Next, position correction on the stage 3 is performed based on the correction value obtained. Namely, the position data of stage 3 measured in the position circuit 49 is sent to the control computer 19, and then to the writing data correcting unit 31, the position data is added to the drift correction value of design data. The synthesized data is sent to the pattern data decoder 22 and the writing data decoder 23.

In writing data correcting unit 31, correction is performed in order for pattern size to be the same size as the design data after the writing, the primary factors which causes the dimensional change of the pattern are the proximity effect, the photographic fog effect and the loading effect.

The proximity effect is the phenomenon wherein the electron irradiated to the resist film is reflected inside the glass substrate, and then re-irradiated to the resist film. The fogging effect is the phenomenon wherein the electron irradiated to the resist film is reflected on the surface of the resist film, it is then reflected from the optical unit of the electron beam writing apparatus, and then re-irradiated over a wide region of resist film. This phenomenon is caused by a secondary electron being irradiated to the resist film. The loading effect is a result of the changing of size which is caused by the difference in area of resist film and light shielding film when the light shielding film as an underlayer is etched using a resist pattern as a mask. The influence of the radius σ of the proximity effect is in the range of 10 mm to 20 mm, furthermore, the influence of the radius of σF of the fogging effect is about 10 mm, further the influence of the radius σL of the loading effect is in the range of 10 mm to 100 mm.

The calculation of correction of irradiation amount of the electron beam at each position of the writing area is referred in the method mentioned in Japanese Patent Laid Open No: 2007-150243. In this method, first the fogging effect correction irradiation amount is calculated at each first mesh area separated into mesh shape by a first measurement in the writing area. The loading effect size value is calculated at each second mesh shaped area separated into a mesh shape by a second measurement in the writing area. A standard irradiating map and a proximity effect correction coefficient map of the electron beam of each second mesh territory are created. Next, proximity correction irradiation amount is calculated at each third mesh area, separated into mesh shapes by third measurement smaller than first and second measurements in writing area, using these maps, and the correction irradiation amount of electron beam at each position in the lighting area is calculated based on the fogging effect, correction irradiation amount and proximity correction irradiation amount.

According to this embodiment, for example, a dimensional correction amount is determined from the difference between the measured dimension and designed dimension of the pattern at a predetermined position on the mask 2, and the writing data correcting unit 31 shown in FIG. 1 produces a dimensional correction map representing the dimensional correction amount. It is to be noted that the dimensional correction map may be produced outside the electron beam writing apparatus. In this case, the produced map may be input into the input unit 20 and read from the control computer 19. Then, the writing data correcting unit 31 determines a corrected dose in accordance with the dimensional correction map, and the dose of the electron beam at the predetermined position on the mask 2 is further determined from the corrected dose. Here, the corrected dose may be at least one of a proximity-effect corrected dose, a fog corrected dose, and a loading-effect corrected dose. The acquired corrected dose is sent to the pattern data decoder 22 and the writing data decoder 23.

The information from the patter data decoder 22 is sent to a blanking circuit 24 and a beam shaper driver 25. Specifically, the pattern data decoder 22 generates blanking data based on the above data and sends it to the blanking circuit 24. The pattern data decoder 22 also generates the desired beam size data and sends it the beam shaper driver 25. The beam shaper driver 25 then applies a predetermined deflection signal to the shaping deflector 14 in the electron beam optical unit 10 to adjust the size of the electron beam 54.

In addition, the information from pattern data decoder 22 is sent to sub-deflection amount calculating unit 28. Sub-deflection amount calculating unit 28, is calculated from the reflective amount (moving distance) from the electron beam, of every one shot at the subfield deflecting area 53, from beam shaped data created in pattern decoder 22. The calculated information is sent to settling time determining unit 29, and then settling time corresponding to the moving distance by sub-deflection is determined.

The settling time determined in settling time determination unit 29 is sent to the deflecting control unit 30, and then is sent to blanking circuit 24, beam shaping driver 25, main deflecting driver 26 or sub deflecting driver 27. Measurement of the timing of writing pattern is sent according to blanking circuit.

The output from the writing data decoder 23 is sent to the main deflector driver 26 and the sub-deflector driver 27. The main deflector driver 26 then applies a predetermined deflection signal to the main deflector 15 in the electron beam optical unit 10 to deflect the electron beam 54 to a predetermined main deflection position. Further, the sub-deflector driver 27 applies a predetermined sub-deflection signal to the sub-deflector 16 to write on a sub-deflection region 53.

Referring to FIG. 1, when placed on the stage 3, the mask 2 is warped due to its own weight. Further, when the bottom surface of the mask 2 is supported by the stage 3, the surface height of the mask 2 is influenced also by the inherent thickness and parallelism of the mask 2. Therefore, the surface height of the mask 2 varies depending on the combination of the surface profile, thickness, parallelism, and warpage of the mask 2, which causes displacement of the irradiation position of the electron beam 54 or defocusing of the electron beam 54, thereby preventing the formation of a desired pattern on the mask 2. For this reason, it is necessary to precisely measure the surface height of the mask 2.

According to this embodiment, the surface height of the mask 2 is first measured before writing to prepare a height data map Hm of the mask 2.

The surface height of the mask 2 placed on the stage 3 is measured by a height measuring unit 40. The height measuring unit 40 includes a light source 41, a projector lens 42 that converges light Li emitted from the light source 41 on the mask 2, a light-receiving lens 43 that receives and converges light Lr reflected from the mask 2, and a light-receiving element 44 that receives the light Lr converged by the light-receiving lens 43 and detects the position of the light.

When the light-receiving element 44 detects the position of the light, the detected position of the light is sent to a height data processing unit 70 through a signal processing unit 60, and the height data processing unit 70 generates height data. More specifically, the height data processing unit 70 receives an output signal from the light-receiving element 44 and converts the output signal into the height data of the surface of the mask 2 which corresponds to the position of the light detected by the light-receiving element 44. According to this embodiment, fitting is performed using this height data to prepare the height data map Hm. More specifically, height data measured by the height measuring unit 40 is processed in the following manner.

The light-receiving element 44 of the height measuring unit 40 outputs two signals ($I_1$, $I_2$). These signals are sent to the height data processing unit 70 through the signal processing unit 60. In the height data processing unit 70, the signals from the light-receiving element 44 are converted from current values into voltage values by an I/V converting amplifier to obtain signals $V_1$ and $V_2$. Then, each of the signals $V_1$ and $V_2$ is amplified to an appropriate voltage level by a non-inverting amplifier, and is then converted into digital data by an A/D converting unit. Then, the height data of the surface of the mask 2 is generated using this data in the following manner.

More specifically, in the height data processing unit 70, the value of $(V_1-V_2)/(V_1+V_2)$ is calculated from the measurement values ($V_1$, $V_2$) (normalization processing). This value is updated at predetermined time intervals (e.g., 20 milliseconds (MS) or less), and the obtained values are time-averaged (averaging processing) to acquire height data $Z_1$ of the surface of the mask 2. It is to be noted that the averaging processing can be performed on values other than the maximum and minimum values in sampled data.

Then, the height data processing unit 70 performs linearity correction processing on the height data $Z_1$ after performing averaging processing in such a manner as described above.

The linearity correction processing is performed to correct the linearity of variation of the surface height of the mask 2. More specifically, the height data processing unit 70 performs polynomial arithmetic processing using specific correction coefficients that allow the variation of the surface height of the mask to be accurately output by multiplying the normalized data obtained by the light-receiving element 44 by a particular resolution (um/bit). The correction coefficients for the polynomial arithmetic are calculated by placing a dummy sample serving as a height reference and determining specific polynomial approximation coefficients that allow the measured heights of the dummy sample to correspond with the dimensions of the dummy sample by the least squares method. Here, the dummy sample is a stepwise sample having a plurality of steps whose dimensions have been accurately measured. The electron beam writing apparatus needs to measure the surface height of the mask 2 as a relative height with respect to its height reference surface. Therefore, the difference between the height data of the height reference surface and the height data of the surface of the mask 2 is determined to acquire height data $Z_2$ of the surface of the mask 2.

Based on the thus acquired height data $Z_2$, the electron beam optical unit 10 is adjusted. More specifically, the height data $Z_2$ acquired by the height data processing unit 70 is sent to the deflection control unit 30, and the pattern data stored in the pattern data memory 21 is also sent to the deflection control unit 30 in such a manner as described above.

Next, the mask 2 is irradiated the electron beam 54 to write a predetermined pattern. This writing process is performed as follows.

First, the mask 2 is placed on the stage 3 in the writing chamber 1. Then, the position circuit 49 detects the position of the stage 3, and based on a signal from the control computer 19, the stage control unit 50 moves the stage 3 to a position where writing can be performed.

Then, the electron gun 6 emits the electron beam 54. The emitted electron beam 54 is focused by the illumination lens 7. Then, the blanking deflector 13 operates so that the mask 2 is either irradiated with the electron beam 54 or not irradiated with the electron beam 54.

The electron beam 54 enters the first aperture 17 and passes through the opening of the first aperture 17, and is then deflected by the shaping deflector 14 controlled by the beam shaper driver 25. Then, the electron beam 54 passes through the opening of the second aperture 18 so as to have desired beam shape and size. The beam shape corresponds to a unit of writing performed by the electron beam 54 emitted toward the mask 2.

After being shaped into such a beam shape, the electron beam 54 is reduced in size by the reducing lens 11. The irradiation position of the electron beam 54 on the mask 2 is controlled by the main deflector 15 controlled by the main deflector driver 26 and the sub-deflector 16 controlled by the sub-deflector driver 27. The main deflector 15 positions the electron beam 54 in the sub-deflection region 53 on the mask 2 (shown in FIG. 2). The sub-deflector 16 positions the electron beam 54 at a writing position in the sub-deflection region 53.

When writing on the mask 2 with the electron beam 54, the beam 54 is caused to scan the mask 2 while the stage 3 is moved in one direction. Specifically, a pattern is written in each sub-deflection region 53 while the stage 3 is moved in one direction. Upon completion of the writing on all the sub-deflection regions 53 in one frame region 52, the stage 3 is moved to a new frame region 52 and the above procedure is repeated to write on the new frame region 52.

According to this embodiment, the surface height of the mask 2 is measured in real time concurrently with writing. The height measurement during writing is performed in the same manner as described above with reference to the case of height measurement performed before writing. More specifically, in the height measuring unit 40, light Li emitted from the light source 41 is converged on the mask 2 by the projector lens 42, and then light Lr reflected from the mask 2 is allowed to enter the light-receiving element 44 through the light-receiving lens 43. The light-receiving element 44 receives the light Lr and detects the position of the light.

When the light-receiving element 44 detects the position of the light, the detected position of the light is sent to the height data processing unit 70 through the signal processing unit 60, and the height data processing unit 70 produces height data Hr. According to this embodiment, the amount of the light Lr reflected from the surface of the mask 2 is measured, and the height data processing unit 70 judges whether or not the amount of the light Lr is equal to or larger than a threshold value. When the amount of the light Lr is equal to or larger than the threshold value, the height data Hr is sent to the deflection control unit 30. When the amount of the light Lr is less than the threshold value, on the other hand, the height data processing unit 70 judges that a precise surface height could not be measured due to, for example, the blocking of the light Li by a substrate cover (not shown) and sends the height data of corresponding coordinates from the height data map Hm acquired before writing to the deflection control unit 30. The deflection control unit 30 adjusts the electron beam optical unit 10 based on the height data sent from the height data processing unit 70.

Figure 3:
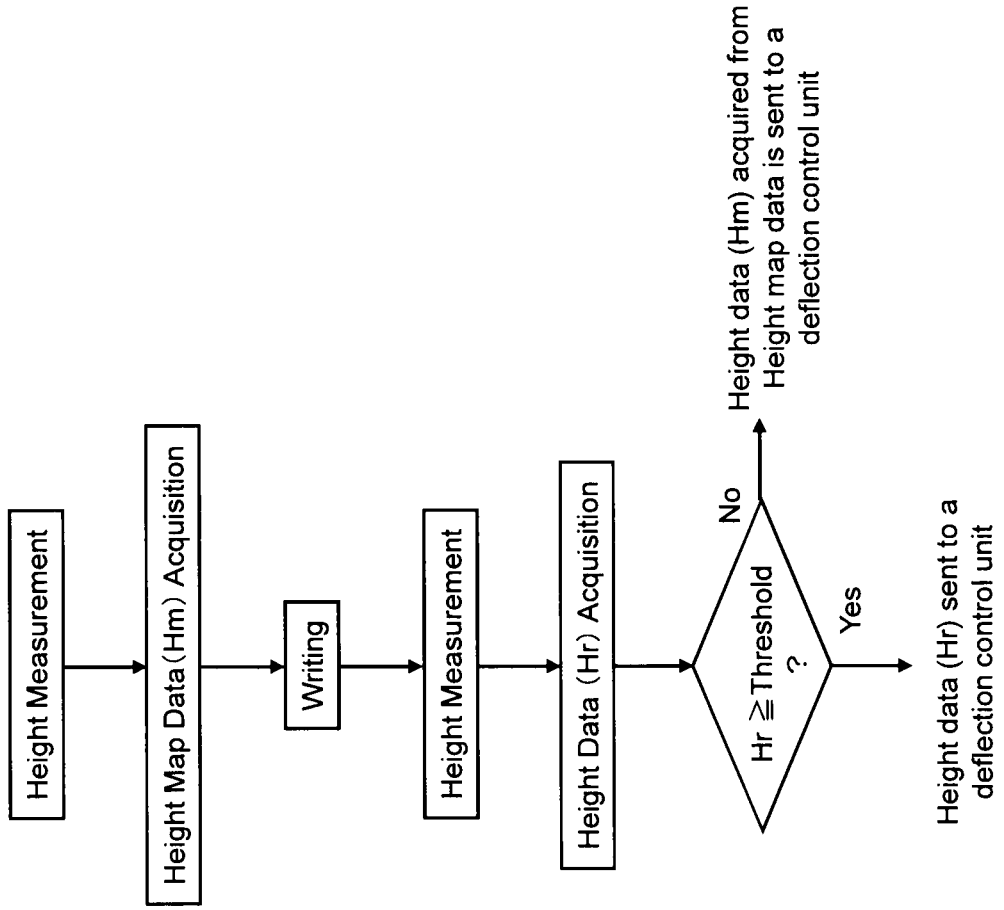
FIG. 3 is a schematic diagram showing flow of data according to the present embodiment.

FIG. 3 is a flowchart showing the process above.

It is to be noted that a region where the light Li is blocked by the substrate cover can be determined in advance, and therefore not the height data Hr but height data acquired from the height data map Hm may be sent to the deflection control unit 30 as the height data of coordinates in this region.

The substrate cover is provided on a support mechanism surrounding the mask placed on the stage. The substrate cover is grounded by connecting the support mechanism to ground, and therefore electrons scattering near the peripheral portion of the mask are captured by the substrate cover so that the peripheral portion of the mask is prevented from becoming charged.

According to this embodiment, the surface height of the mask 2 is measured concurrently with writing to focus the electron beam 54 based on the acquired height data Hr, which makes it possible to achieve precise focusing and positional correction. Further, the height data processing unit 70 judges whether or not the amount of light Lr reflected from the surface of the mask 2 is equal to or larger than a threshold value during height measurement, and when the amount of the light is less than the threshold value, the height data map Hm acquired before writing is used instead of the height data Hr to focus the electron beam 54. According to this method, it is possible to prevent the lack of data even when precise height data Hr cannot be acquired by height measurement during writing due to the shortage of the amount of the light Lr.

Figure 4:
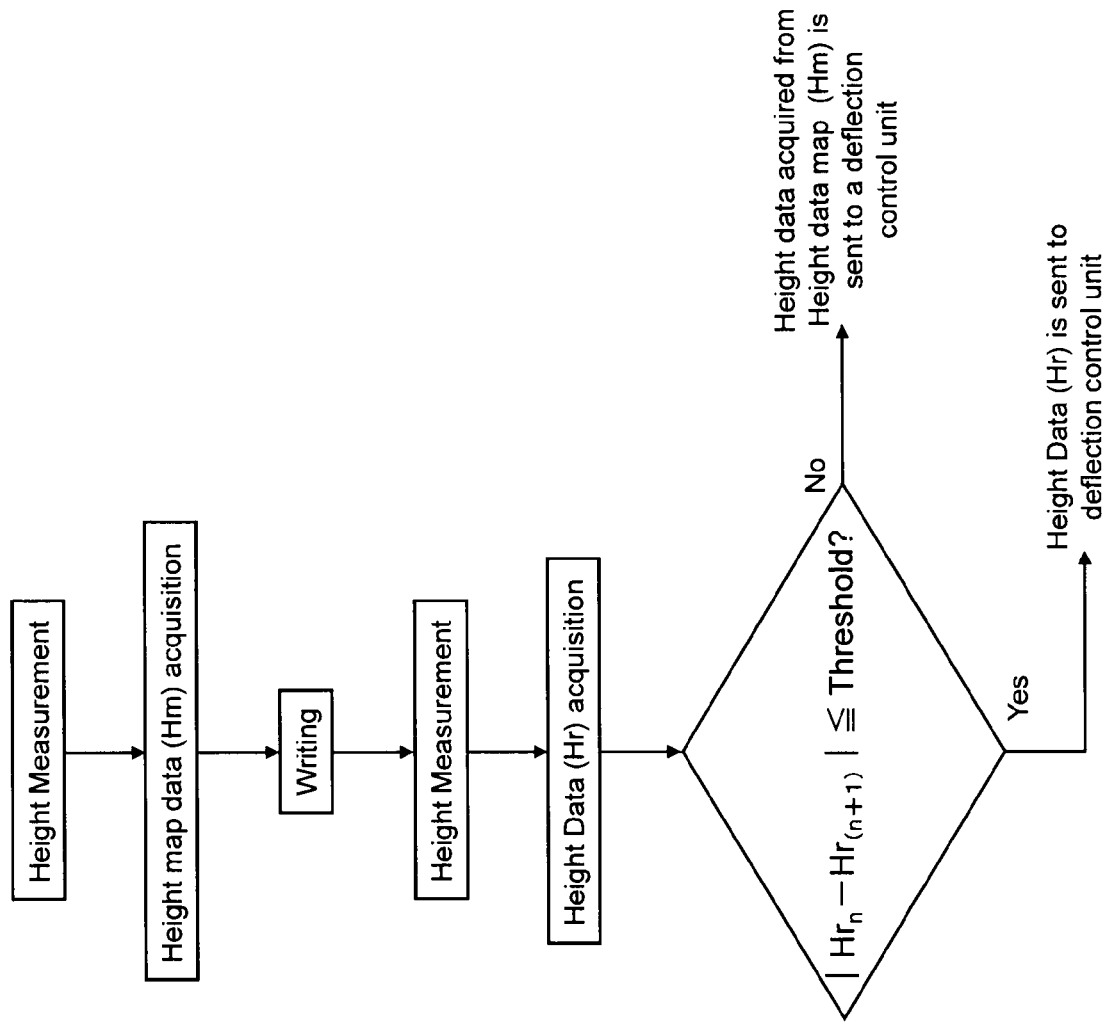
FIG. 4 is another schematic diagram showing flow of data according to the present embodiment.

In this embodiment, the writing can be performed by process according to flowchart shown in FIG. 4

The surface height of the mask 2 is measured before writing in the same manner as described above to acquire height data map Hm. Then, the surface height of the mask 2 is measured in real time concurrently with writing. Data measured by the height measuring unit 40 is sent to the height data processing unit 70 through the signal processing unit 60. Then, the height data processing unit 70 produces height data Hr.

In the case of an example shown in FIG. 4, the height data processing unit 70 determines the difference between $n^{th}$ acquired height data $Hr_n$ (n: integer) and $(n+1)^{th}$ acquired height data $Hr_{(n+1)}$. Therefore, the $n^{th}$ acquired height data $Hr_n$ is stored in the height data processing unit 70 until at least then.

When the difference determined above is equal to or less than a threshold value, the height data $Hr_{(n+1)}$ is sent to the deflection control unit 30. When the difference determined above is larger than the threshold value, on the other hand, the height data processing unit 70 judges that there has been height data not acquired by the height data processing unit 70 due to poor data communication in the electron bean writing apparatus between the $n^{th}$ acquired height data $Hr_n$ and the $(n+1)^{th}$ acquired height data $Hr_{(n+1)}$, and the height data of coordinates between $n^{th}$ coordinates and $(n+1)^{th}$ coordinates is sent from the height data map Hm acquired before writing to the deflection control unit 30. The deflection control unit 30 adjusts the electron beam optical unit 10 based on the height data sent from the height data processing unit 70.

Also in the case of such a method shown in FIG. 4, the surface height of the mask 2 is measured concurrently with writing to focus the electron beam 54 based on the acquired height data Hr, which makes it possible to achieve precise focusing and positional correction. Further, the height data processing unit 70 judges whether or not the difference between $n^{th}$ acquired height data $Hr_n$ and $(n+1)^{th}$ acquired height data $Hr_{(n+1)}$ is equal to or less than a threshold value during height measurement, and when the difference is larger than the threshold value, the height data map Hm acquired before writing is used instead of the height data Hr to focus the electron beam 54. According to this method, it is possible to prevent the lack of data even when height data Hr cannot be acquired by height measurement during writing due to, for example, poor data communication.

Figure 5:
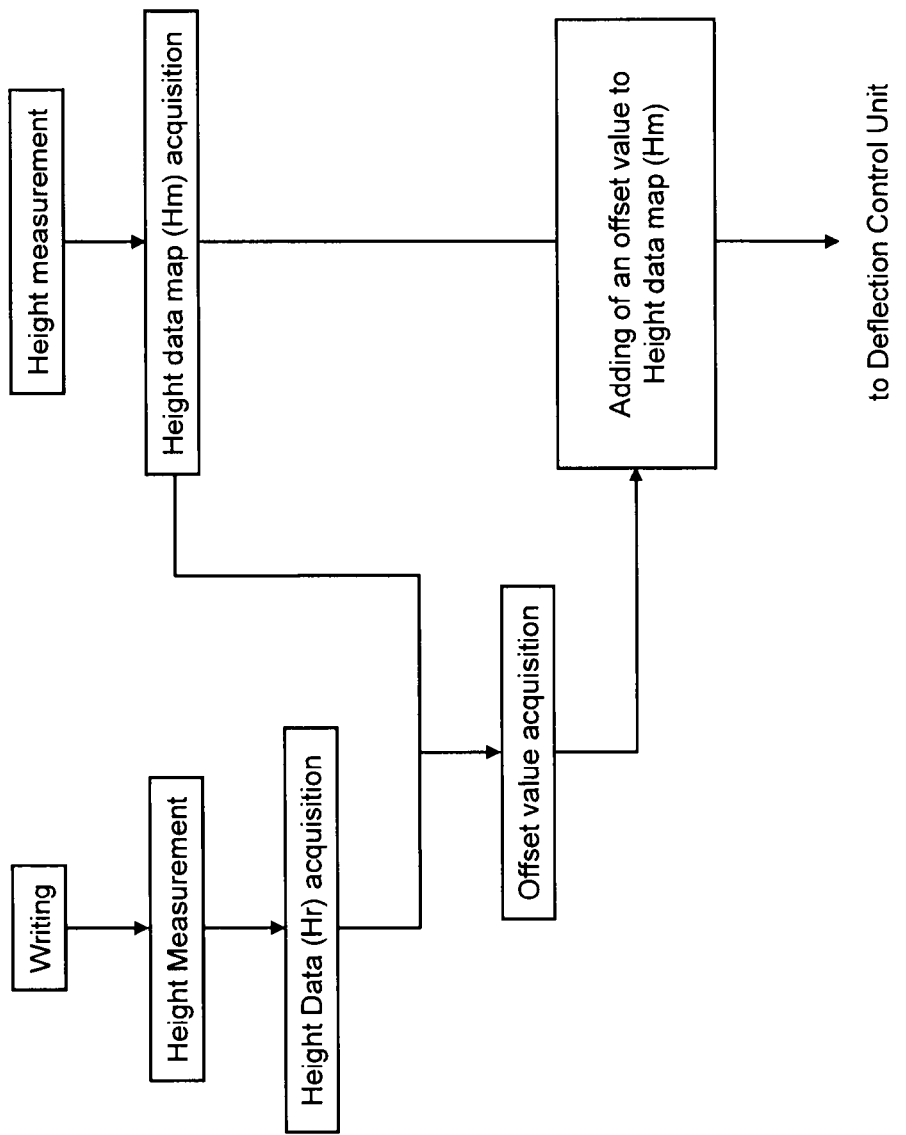
FIG. 5 is another schematic diagram showing flow of data according to the present embodiment.

Further, according to this embodiment, writing can be performed also by a procedure illustrated in the flowchart shown in FIG. 5.

The surface height of the mask 2 is measured before writing in the same manner as described above to acquire height data map Hm. Then, the surface height of the mask 2 is measured in real time concurrently with writing. Data measured by the height measuring unit 40 is sent to the height data processing unit 70 through the signal processing unit 60. Then, the height data processing unit 70 produces height data Hr.

In the case of an example shown in FIG. 5, the height data processing unit 70 determines an offset value and sends a value, obtained by adding the offset value to height data acquired from the height data map Hm, to the deflection control unit 30.

The offset value is a difference between the height data Hr and the height data of coordinates, corresponding to the height data Hr, acquired from the height data map Hm. Here, the height data map Hm contains height data including measured values and height data including values determined from the measured values by interpolation. The offset value is updated only when the amount of light Lr reflected from the surface of the mask 2 is equal to or larger than a threshold value.

According to such a method shown in FIG. 5, the surface height of the mask 2 is measured concurrently with writing, and an offset value is determined from the acquired height data Hr and the height data map Hm. Then, the electron beam 54 is focused based on a corrected value of the height data map Hm, which makes it possible to achieve precise focusing and position correction.

The features and advantages of the present invention may be summarized as follows.

According to the present invention, there is provided a charged-particle beam writing apparatus capable of performing high-precision writing on a sample while precisely measuring the surface profile of the sample.

The present invention is not limited to the above embodiments and may be modified in various forms without departing from the scope of the invention.

For example, with form of the above-mentioned execution an electron beam was used, however, the present invention is not limited thereto and may utilize a different charged particle beam, for example an ion beam.

What is claimed is:

1. A charged-particle beam writing apparatus for writing a predetermined pattern on a sample placed on a stage with a charged-particle beam, the apparatus comprising:
    a height measuring unit that measures a height of the sample by irradiating the sample with light and receiving light reflected from the sample; and
    a control unit that receives either height data acquired from a height data map prepared based on values measured by the height measuring unit before writing or height data measured by the height measuring unit during writing to adjust an irradiation position of the charged-particle beam on the sample.

2. The charged-particle beam writing apparatus according to claim 1, wherein the height measuring unit measures the height of the sample in real time concurrently with writing.

3. The charged-particle beam writing apparatus according to claim 1, wherein when an amount of the reflected light is equal to or larger than a threshold value, the control unit receives height data measured by the height measuring unit during writing, and when the amount of the reflected light is less than the threshold value, the control unit receives height data acquired from the height data map.

4. The charged-particle beam writing apparatus according to claim 1, wherein the control unit receives height data acquired from the height data map as height data of coordinates within a predetermined region.

5. The charged-particle beam writing apparatus according to claim 4, wherein the apparatus comprising:
a support mechanism that is provided so as to surround the sample placed on the stage,
a substrate cover that is provided on the support mechanism,
wherein the substrate cover is grounded by connecting the support mechanism to ground,
wherein the predetermined region is a region where the irradiated light is blocked by the substrate cover.

6. The charged-particle beam writing apparatus according to claim 1, wherein when a difference between height data measured by the height measuring unit during writing and height data measured previously is equal to or less than a threshold value, the control unit receives the height data measured by the height measuring unit during writing, and when the difference is larger than the threshold value, the control unit receives height data acquired from the height data map.

7. A charged-particle beam writing apparatus for writing a predetermined pattern on a sample placed on a stage with a charged-particle beam, the apparatus comprising:
a height measuring unit that measures a height of the sample by irradiating the sample with light and receiving light reflected from the sample; and
a control unit that receives a value obtained by adding an offset value, obtained from a difference between height data acquired from a height data map prepared based on values measured by the height measuring unit before writing and height data measured by the height measuring unit during writing, to the height data map to adjust an irradiation position of the charged-particle beam on the sample.

8. The charged-particle beam writing apparatus according to claim 7, wherein the height data map contains height data including measured values, and height data including values determined from the measured values by interpolation.

9. The charged-particle beam writing apparatus according to claim 7, wherein the offset value is updated only when the amount of light reflected from the surface of the sample is equal to or larger than a threshold value.

10. A charged-particle beam writing method for writing a predetermined pattern on a sample placed on a stage with a charged-particle beam, the method comprising:
measuring a height of the sample by irradiating the sample with light and receiving light reflected from the sample; and
using either height data acquired from a height data map prepared based on values measured before writing, or height data measured during writing to adjust an irradiation position of the charged-particle beam on the sample.

11. The charged-particle beam writing method according to claim 10, wherein the measurement of height of the sample is performed in real time concurrently with writing.

12. The charged-particle beam writing method according to claim 10, wherein when an amount of the reflected light is equal to or larger than a threshold value, using height data measured during writing, and when the amount of the reflected light is less than the threshold value, using height data acquired from the height data map.

13. The charged-particle beam writing method according to claim 10, wherein height data acquired from the height data map is received as height data of coordinates within a predetermined region.

14. The charged-particle beam writing method according to claim 13, a support mechanism is provided so as to surround a mask placed on a stage, and
providing a substrate cover on the support mechanism,
wherein the substrate cover is grounded by connecting the support mechanism to ground, and
wherein the predetermined region is a region where the irradiated light is blocked by the substrate cover.

15. The charged-particle beam writing method according to claim 10, wherein the height data measured during writing is used when a difference between height data measured during writing, and height data measured previously is equal to or less than a threshold value, and using height data acquired from the height data map when the difference is larger than the threshold value.

16. A charged-particle beam writing method for writing a predetermined pattern on a sample placed on a stage with a charged-particle beam, the method comprising:
measuring a height of the sample by irradiating the sample with light and receiving light reflected from the sample; and
using a value obtained by adding an offset value, obtained from a difference between height data acquired from a height data map prepared based on values measured before writing, and height data measured during writing, to the height data map to adjust an irradiation position of the charged-particle beam on the sample.

17. The charged-particle beam writing method according to claim 16, wherein the height data map contains height data including measured values and height data including values determined from the measured values by interpolation.

18. The charged-particle beam writing method according to claim 16, wherein the offset value is updated only when the amount of light reflected from the surface of the sample is equal to or larger than a threshold value.

* * * * *